United States Patent [19]
Blaum et al.

[11] Patent Number: 6,089,749
[45] Date of Patent: Jul. 18, 2000

[54] BYTE SYNCHRONIZATION SYSTEM AND METHOD USING AN ERROR CORRECTING CODE

[75] Inventors: Mario Blaum, San Jose; Denny Duan-lee Tang, Saratoga, both of Calif.; Takeo Yasuda, Shiga-ken, Japan

[73] Assignee: International Business Machines Corporation, Armonk, N.Y.

[21] Appl. No.: 08/889,363

[22] Filed: Jul. 8, 1997

[51] Int. Cl.[7] .............................. G06F 11/00; H04L 12/00
[52] U.S. Cl. ....................... 371/47.1; 371/43.7; 371/43.6; 371/46
[58] Field of Search ........................... 371/47.1, 48, 43.7, 371/46, 43.6; 375/357

[56] References Cited

U.S. PATENT DOCUMENTS

| | | | |
|---|---|---|---|
| 4,633,733 | 1/1987 | Getson, Jr. et al. | 364/900 |
| 4,644,564 | 2/1987 | Dolivo et al. | 375/18 |
| 4,710,920 | 12/1987 | Manning | 370/100 |
| 4,847,877 | 7/1989 | Besseyre | 375/116 |
| 4,933,786 | 6/1990 | Wilson | 360/78.14 |
| 5,010,559 | 4/1991 | O'Connor et al. | 375/116 |
| 5,073,906 | 12/1991 | Otani et al. | 375/116 |
| 5,196,849 | 3/1993 | Galbraith | 341/59 |
| 5,241,309 | 8/1993 | Cideciyan et al. | 341/59 |
| 5,260,703 | 11/1993 | Nguyen et al. | 341/100 |
| 5,280,489 | 1/1994 | Fredrickson et al. | 371/45 |
| 5,327,440 | 7/1994 | Fredrickson et al. | 371/43 |
| 5,341,387 | 8/1994 | Nguyen | 371/45 |
| 5,357,520 | 10/1994 | Arnett et al. | 371/21.2 |
| 5,448,571 | 9/1995 | Hong et al. | 370/105.4 |
| 5,497,384 | 3/1996 | Fredrickson et al. | 371/43 |
| 5,502,736 | 3/1996 | Todoroki | 371/43 |

*Primary Examiner*—Phung M. Chung
*Attorney, Agent, or Firm*—Khanh Q. Tran; Morgan & Finnegan

[57] ABSTRACT

A byte synchronization detection system and method in which a vector subtractor circuit determines an error vector between a current read data pattern and a synchronization bit pattern, and an offset adder circuit determines a Hamming Distance of the next read data pattern by adding the difference between the Hamming Distance from current error vector to the synchronization bit pattern and the Hamming Distance from the next error vector to the synchronization bit pattern. The Hamming Distance is determined by selected elements of the error vector which are the output from the vector subtractor circuit. The offset adder circuit determines a difference between the Hamming Distance of the current read data pattern and of the next read data pattern. The synchronization bit pattern is between 16 and 18 bits in length, inclusive. This approach reduces the probability of synchronization failure and/or mis-synchronization about 4 orders of magnitude over conventional approaches, while also reducing the length of the byte synchronization pattern to 16 bits.

14 Claims, 15 Drawing Sheets

BYTE SYNCHRONIZATION SYSTEM AND METHOD USING AN ERROR CORRECTING CODE

BACKGROUND OF THE INVENTION

1. Field of the Invention

The present invention relates to the field of data coding and electronic circuits. More particularly, the present invention relates to a system and a method that provides byte synchronization for detecting data using partial-response signaling with maximum-likelihood (PRML) sequence detection techniques.

2. Description of the Related Art

When transmitting data, header information is attached in front of the data to set up the receiver. Byte synchronization must be included in the header for identifying the position of the first data bit of the data bits. Such byte synchronization is sometimes called a "timing mark." In a partial-response with maximum-likelihood sequence detection (PRML) maximum recording channel, byte synchronization is used to mark the first bit of a symbol. In conventional byte synchronization techniques, special bit sequences, or patterns, that indicate beginnings of data blocks are detected by a Viterbi detector and a synchronization symbol detector. For example, in a partial-response class-IV (PR-IV or PR4) system running in 9/8 code, a 9-bit pattern, such as "111101111", is repeated three times for byte synchronization detection after the occurrence of an all "1s" bit pattern that is used for bit synchronizing a voltage-controlled oscillator (VCO). By repeating the special data sequence three times, the total length of the conventional synchronization code for the PR4 system is 27 bits.

Conventional byte synchronization also uses a 2-of-3 pattern matching voting scheme for handling situations when one of the three repeated synchronization patterns has detection errors. A synchronization detection error can be caused by a bad Viterbi input sample, for example. The occurrence of more than 2 bad input samples during synchronization detection may cause a synchronization failure (failure to realize synchronization) or a mis-synchronization condition (synchronize to a false bit position).

In a PR4 system, adjacent samples are interleaved and are independent from each other. A Viterbi detector for such a system uses two samples from the same interleaved sample group for symbol detection. In a noiseless PR4 system, all Viterbi detector input samples $S_i$ are defined to be the symbols 1, 0 and −1. The sample sequences 1, 0*, 1 and −1, 0*, −1 are not allowed in a 2-way interleaved sample group. The symbol 0*, as used herein, means: 1) the occurrence of no 0 symbol, or 2) the occurrence of equal to or more than one 0 symbol. For example, "1, −1", "−1, 0, 1" and "−1, 0, 0, 1" are allowed sequences, while "1, 1", "−1, 0, −1" and "1, 0, 0, 1" are not allowed. Due to this restriction, symbol detection error situations can be grouped by cases of symmetrical symbol sequences so that only the 4 possible cases of symbol sequences, shown in FIG. 1, need be considered.

A Viterbi input sample $S_i$ is given by $$S_i = X_i + N_i \qquad (1)$$

where $X_i$ is the originally recorded symbol value and $N_i$ represents noise, both measured in analog-to-digital converter (ADC) LSB levels. Noise $N_i$ is defined herein to be Gaussian. Viterbi detector symbol detection decisions are based on combining two samples $S_{i-2k}$ and $S_i$, where k is an error separation number. If the two samples $S_{i-2k}$ and $S_i$ include noise $N_{i-2k}$ and $N_i$, respectively, that have magnitudes causing symbol detection decision errors, the two samples are considered to be a bad sample combination. Otherwise, the samples are considered to be a good sample combination. One bad sample combination causes two code bit errors. Exemplary good and bad sample combinations are shown in FIGS. 2–5 for each of the four cases shown in FIG. 1.

The Viterbi detector difference metric $DJ_{i-2k}$ is based on previous samples. For the exemplary analog-to-digital converter (ADC) output having a sample sequence 16, 0, −16 corresponding to the symbol sequence 1, 0, −1, if symbol sample $S_i$ is within ±8 LSBs from $DJ_{i-2k}$, then $DJ_i$ is equal to $DJ_{i-2k}$. So, if a 0 symbol is detected k+1 times consecutively, where k>1 (FIG. 5B), the detection decision is based on $S_i$ and the previous potential maximum or potential minimum sample $S_{i-2k}$. In other words, the bad sample combination includes two noise values $N_{i-2k}$ and $N_i$ that have a difference that is greater than or equal to 16 LSBs. For example, in FIG. 2B, the bad sample combination includes noise samples $N_{i-2k}=10$ and $N_i=-8$. The difference between the two noise samples is greater than 16, and is large enough to cause detection errors.

Based on this, the probability ($P_{err}$) of a bad sample combination for a Viterbi detector can be expressed by:

$$P_E(i, i-2k) = \sum_j P(N_i = j) * P(N_{i-2k} \geq j + 16), \qquad (2)$$

where the term $P(N_i=j)$ is the probability that the noise $N_i$ equals j×LSB, and the term $P(N_{i-2k} \geq j+16)$ is the probability that the noise $N_{i-2k}$ is greater than or equal to (j+16)×LSB. While the summation range is different for each of the four cases, the probability of a bad sample combination for each of the four cases is expected to be almost the same because $P(N_i=j)$ is so small that it can be neglected when the absolute value of j becomes large. For example, $P(N_i=16)=5.1\times10^{-8}$ at a signal-to-noise ratio (SNR) of 16 dB. The Viterbi detector error probability ($P_{err}$) can be estimated for any case using Equation (2) and is plotted in FIG. 6.

FIG. 7 shows a schematic block diagram for a conventional byte synchronization circuit 70. Circuit 70 uses a 7-bit shift-register 71, a pattern matching gate 72, a latch L1 and an 18-bit shift-register 73. FIG. 8 shows a timing diagram for circuit 70. To implement correct byte synchronization, a write circuit (FIG. 9) includes a magnet trimming circuit. The magnet trimming circuit changes the write data path delay depending upon the precoder's initial values when the byte synchronization pattern is applied to the circuit. FIG. 9 shows a schematic block diagram of a conventional write circuit 90 having a magnet trimming circuit 91 and a precoder circuit 92 that operate in conjunction with circuit 70. FIG. 10 is a diagram of possible magnet patterns for magnet trimming circuit 90 for the 4 cases, which gives the same output codes in FIG. 8 (111 . . . 111101111111101111111011111). The write circuit adjusts the write path delay so that either pattern (1) or (2), shown in FIG. 10, is written because circuit 70 can detect byte synchronization only for these two patterns, not for patterns (3) and (4) shown in FIG. 10. A mod-2 sync phase control signal is generated by dividing the data clock in circuit 70 by two and is used for achieving correct byte synchronization.

For the conventional system shown in FIGS. 7–10, 7 internal bits are used for pattern matching for each 9-bit pattern because the error separation number k in Equation (2) is likely to be 1 when no 0 bit occurs in the code bit pattern. Consequently, a single bad bit sample does not destroy two adjacent 9-bit synchronization sequences simultaneously. Nevertheless, the one bad bit sample destroys one adjacent synchronization byte sequence. For example, an error at the eighth bit of a 9-bit code pattern is likely to occur with an error at the first bit of the subsequent code pattern because there is no 0 bit at either the beginning or the end of the synchronization code. Since the first and last bytes in the 9-bit synchronization byte are not used for pattern matching, this error destroys only the first synchronization byte code. Taking this into consideration, the conventional approach provides that one bad sample combination is allowed in any of the three repeated 9-bit code sequences for achieving correct byte synchronization. However, two to four bad bit sample combinations in the 27-bit code pattern may cause synchronization failure or a mis-synchronization condition. More than four bad bit sample combinations in the 27-bit synchronization pattern causes a synchronization failure.

Thus, the conventional byte synchronization approach has the disadvantage of a long synchronization pattern (27 bits). Further, the probability of a synchronization failure and/or a mis-synchronization condition is not insignificant. For example, because one bad sample combination causes 2 code bit errors, the probability $P_{sync\ fail}$ of a synchronization failure and/or a mis-synchronization condition is calculated using the following equation:

$$P(E > m) = 1 - \sum_{r=0}^{m} \binom{n}{r} P_{err}^r (1 - P_{err})^{n-r}, \quad (3)$$

where $P_{err}$ is obtained from Equation (2), and n=27 and m=1. Using the $P_{err}$ value from FIG. 6, $P_{sync\ fail}$ is calculated as shown in FIG. 16 (curve 161). From FIG. 6, $P_{sync\ fail}$ is $3.1 \times 10^{-6}$ for an SNR=16 dB. Further still, write magnet trimming techniques are required for writing the special synchronization pattern.

Consequently, what is needed is a system and a method that uses a shorter synchronization pattern while providing a greater byte synchronization certainty than conventional byte synchronization approaches without requiring write magnet trimming for writing the synchronization pattern.

SUMMARY OF THE INVENTION

The present invention provides a system and a method that uses a shorter synchronization pattern while providing a greater synchronization certainty than conventional approaches without requiring write magnet trimming for writing the synchronization pattern. The present invention uses an ECC (Error Correcting Code) and checks the Hamming Distance $d_H$ for detecting byte synchronization. The advantages of the present invention are provided by a byte synchronization detection system and method in which a vector subtractor circuit determines a difference vector between a current read data pattern and a synchronization bit pattern, and an offset adder circuit determines a distance of the next read data pattern by adding the difference of the current Hamming Distance $d_{H\ curr}$ and the next Hamming Distance $d_{H\ next}$ to a Hamming Distance of the current read data pattern. The offset adder circuit determines a difference between the Hamming Distance of the current read data pattern and a Hamming Distance of the next read data pattern. The synchronization bit pattern is formed from a predetermined sequence of predetermined signals, or bits, is between 16 and 18 bits in length, inclusive, and is preferably 16 bits in length.

According to the invention, the vector subtractor circuit includes only a shift register. The shift register is formed from a plurality of sequentially connected latches. Each latch output corresponds to an exclusive-or'ed result of adjacent bits of the synchronization pattern. If the adjacent bits in the ECC synchronization pattern are different, the complement (inverted) output of the corresponding latch is connected to the next latch. If the adjacent bits are the same, the true (non-inverted) output is connected to the next latch. The vector subtractor outputs (b0, b1, . . . , b15) form a difference vector between the input vector and the ECC synchronization pattern vector, although it does not use a subtractor or exclusive-or gates.

BRIEF DESCRIPTION OF THE DRAWINGS

The present invention is illustrated by way of example and not limitation in the accompanying figures in which like reference numerals indicate similar elements and in which:

FIGS. 4A and 5B are graphic representations of exemplary good and bad sample detection cases, respectively, for case 4 shown in FIG. 1;

DETAILED DESCRIPTION

The present invention provides a system and a method using an Error Correcting Code (ECC) byte synchronization approach that provides a greater synchronization certainty than conventional approaches. Additionally, the present invention uses a shorter synchronization code length than the conventional approach. The present invention does not use as complicated configuration as a conventional byte synchronization system and, consequently, operates with less gate delay and with less hardware than that of conventional approaches.

The present invention uses an ECC pattern of between 16- and 18-bits and having a Hamming distance of at least 9 for a 16-bit pattern and 10 for an 18-bit pattern. Accordingly, the ECC pattern of the present invention can correct up to 4 errors (2 bad samples). Table I shows preferred ECC patterns having the minimum Hamming distance of d=9 or 10 for an all "1s" pattern for VCO bit synchronization.

TABLE I

| Code Length | Preferred Code | # of codes | Distance |
|---|---|---|---|
| 16 | 1011100100101000 | 1 | 9 |
| 17 | 0001001100101000 etc. | 140 | 9 |
| 18 | 100101011001100000 etc. | 4 | 10 |

By using an ECC pattern shown in Table I, up to s errors can be corrected and up to s+t errors can be detected, where $2s+t \leq d-1$. For these codes, the maximum s is 4. Consequently, when codes having a distance of 9 are used, up to 4 errors can be corrected. The advantages of the patterns having lengths 1=16, 17 and 18, shown in Table I, are that up to two bad sample combinations are allowed anywhere in the pattern for achieving correct synchronization, and more than two bad sample combinations within 1 consecutive samples may cause a synchronization failure or a mis-synchronization condition.

The probability $P(E>m)$ of more than m bad sample combinations within n consecutive samples is given by Equation (3). The probability is equal to $P_{sync\ fail}$.

Figure 16:
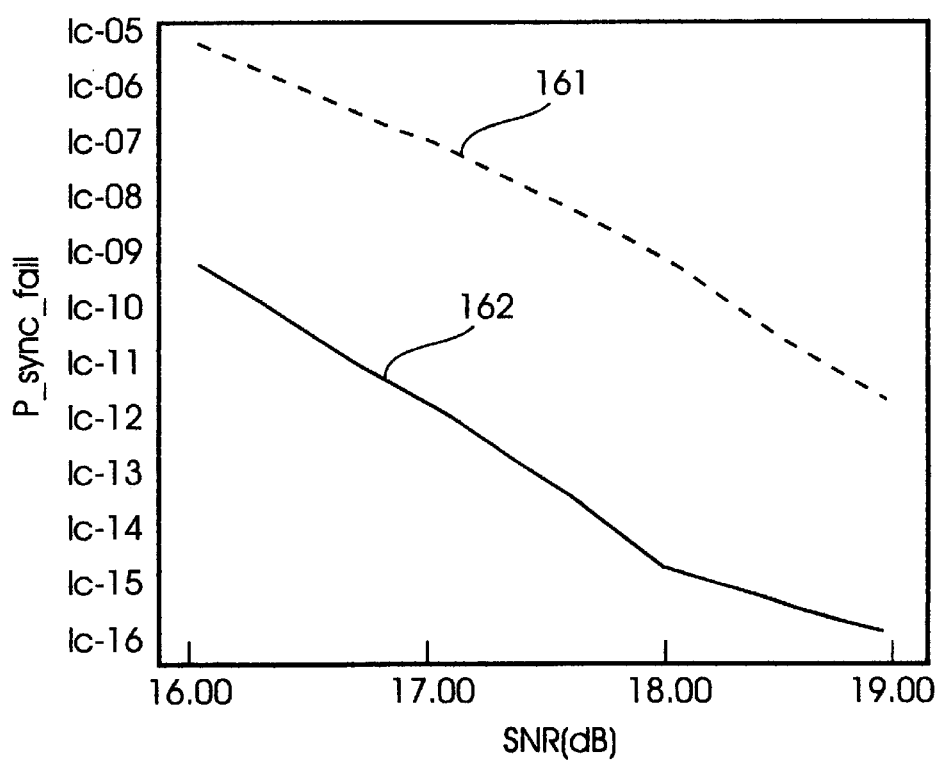
FIG. 16 is a graph showing byte synchronization failure or mis-synchronization probability ($P_{sync\ fail}$) versus signal-to-noise ratio (SNR) for the prior art and for the present invention.

When a length 1 and a code having a minimum distance d (correcting number $s \leq d/2$) is used, n and m are 1 and s/2, respectively. The conventional byte synchronization approach may experience a synchronization failure when two bad sample combinations occur. For the conventional case, n and m are 27 and 1, respectively. When a pattern length of 16 is used according to the present invention, n and m are 16 and 2, respectively. FIG. 16 shows the probability of synchronization failure $P_{sync\ fail}$ for a 16-bit ECC pattern (curve 162). $P_{sync\ fail}$ is improved from $3.1 \times 10^{-6}$ at an SNR=16 dB for the conventional approach to $4.7 \times 10^{-10}$ at an SNR=16 dB for a 16-bit synchronization pattern of the present invention. Similarly, $P_{sync\ fail}$ is improved from $1.8 \times 10^{-12}$ at an SNR=19 dB for the conventional approach to $1.5 \times 10^{-16}$ at an SNR=19 dB for a 16-bit synchronization pattern of the present invention.

Figure 1:
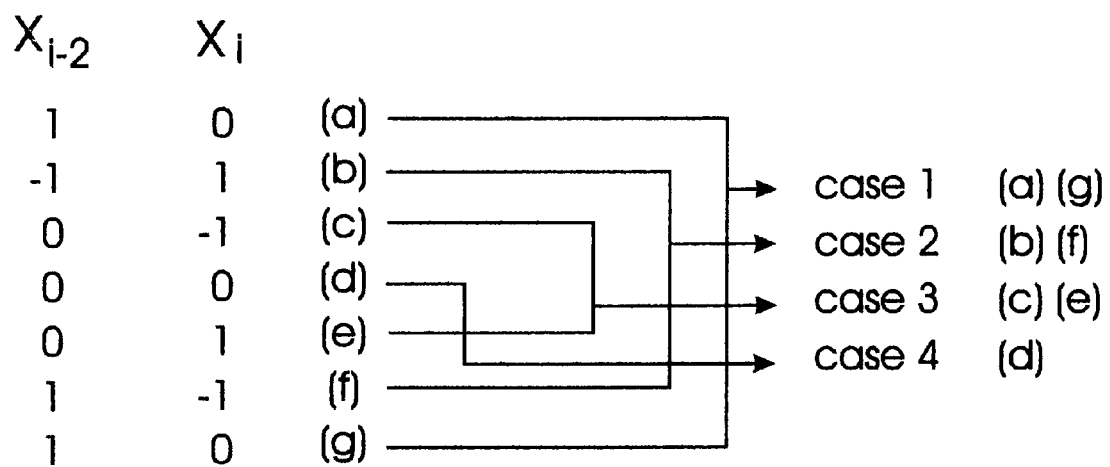
FIG. 1 is a graphic representation of possible cases of symmetrical symbol sequences for a Viterbi detector.
Figure 2:
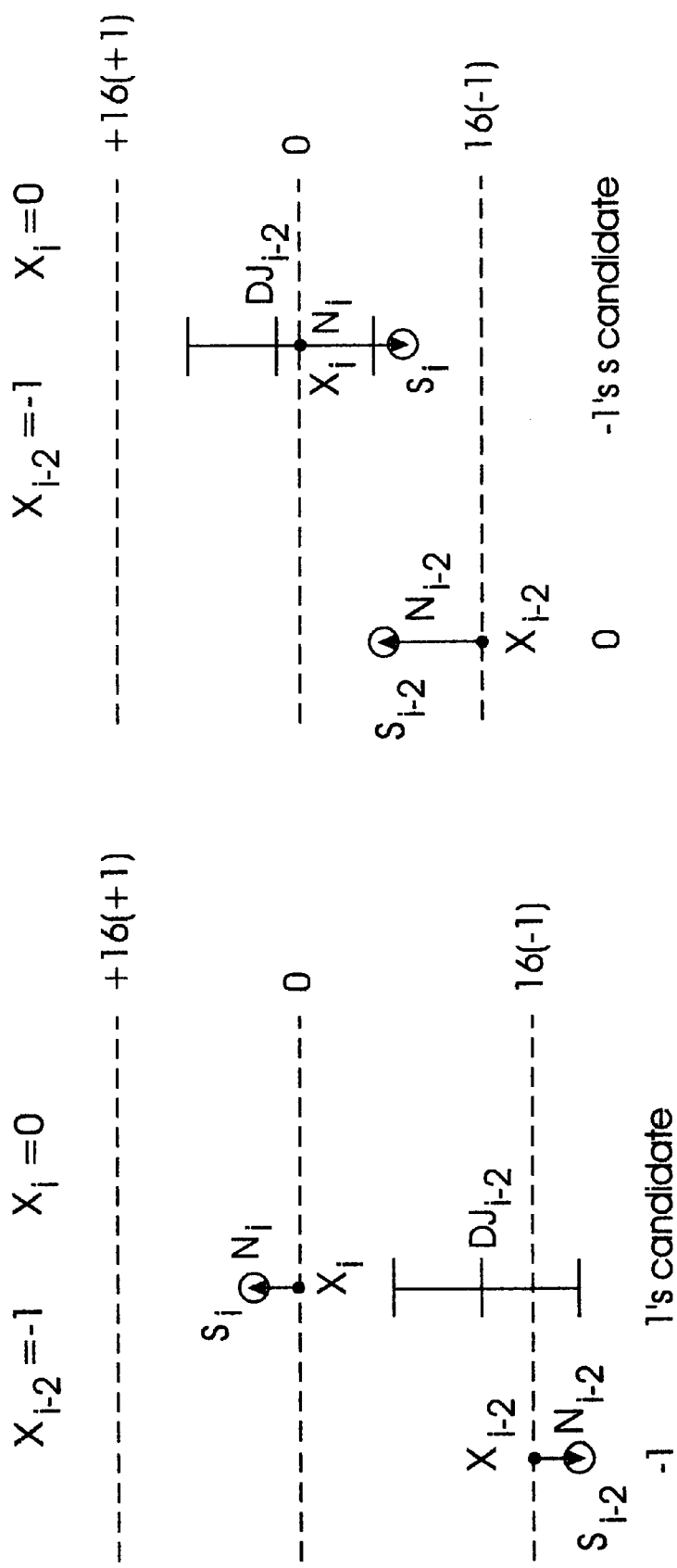
FIGS. 2A and 2B are graphic representations of exemplary good and bad sample detection cases, respectively, for case 1 shown in FIG. 1.
Figure 3:
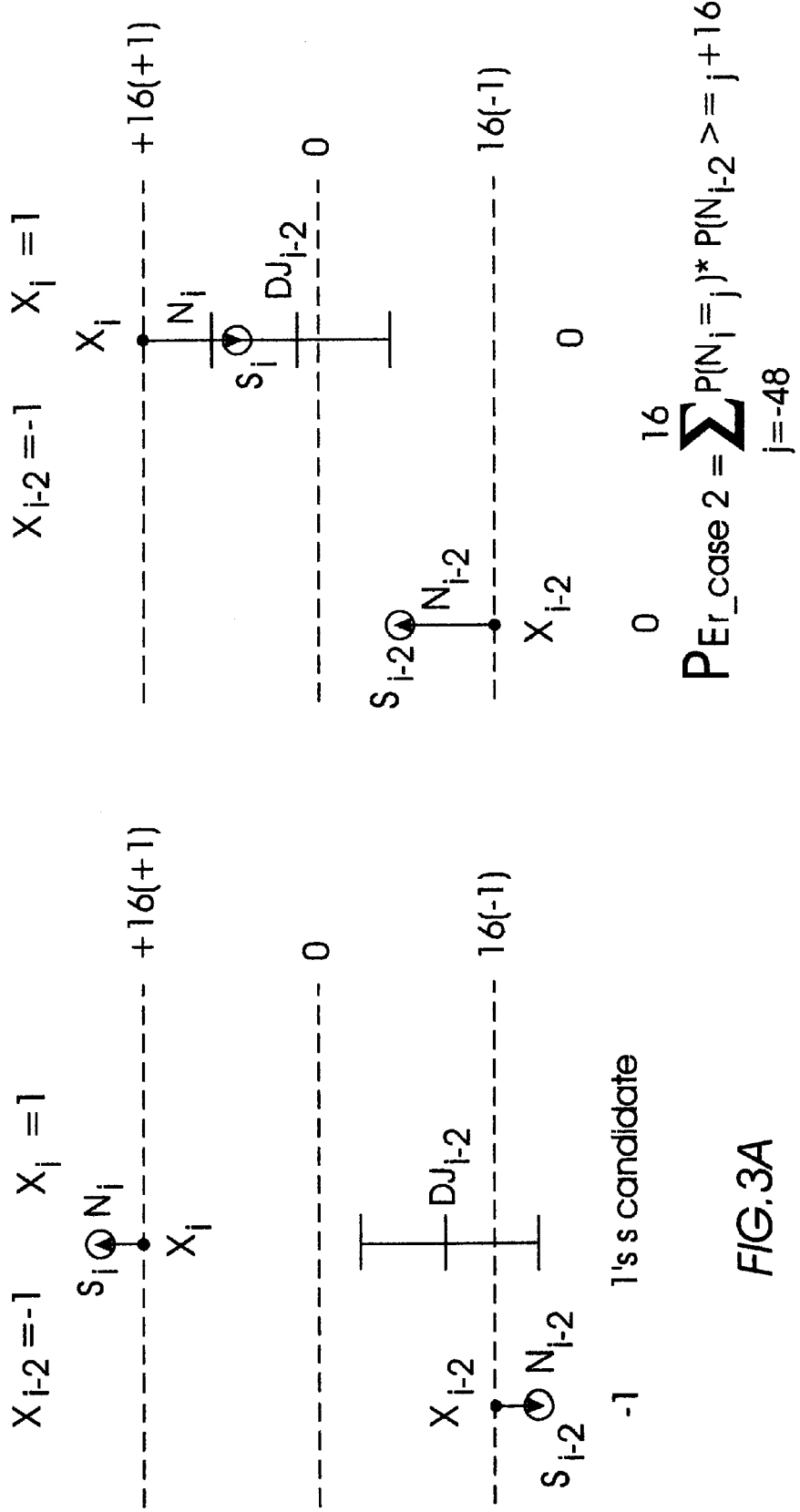
FIGS. 3A and 3B are graphic representations of exemplary good and bad sample detection cases, respectively, for case 2 shown in FIG. 1.
Figure 4:
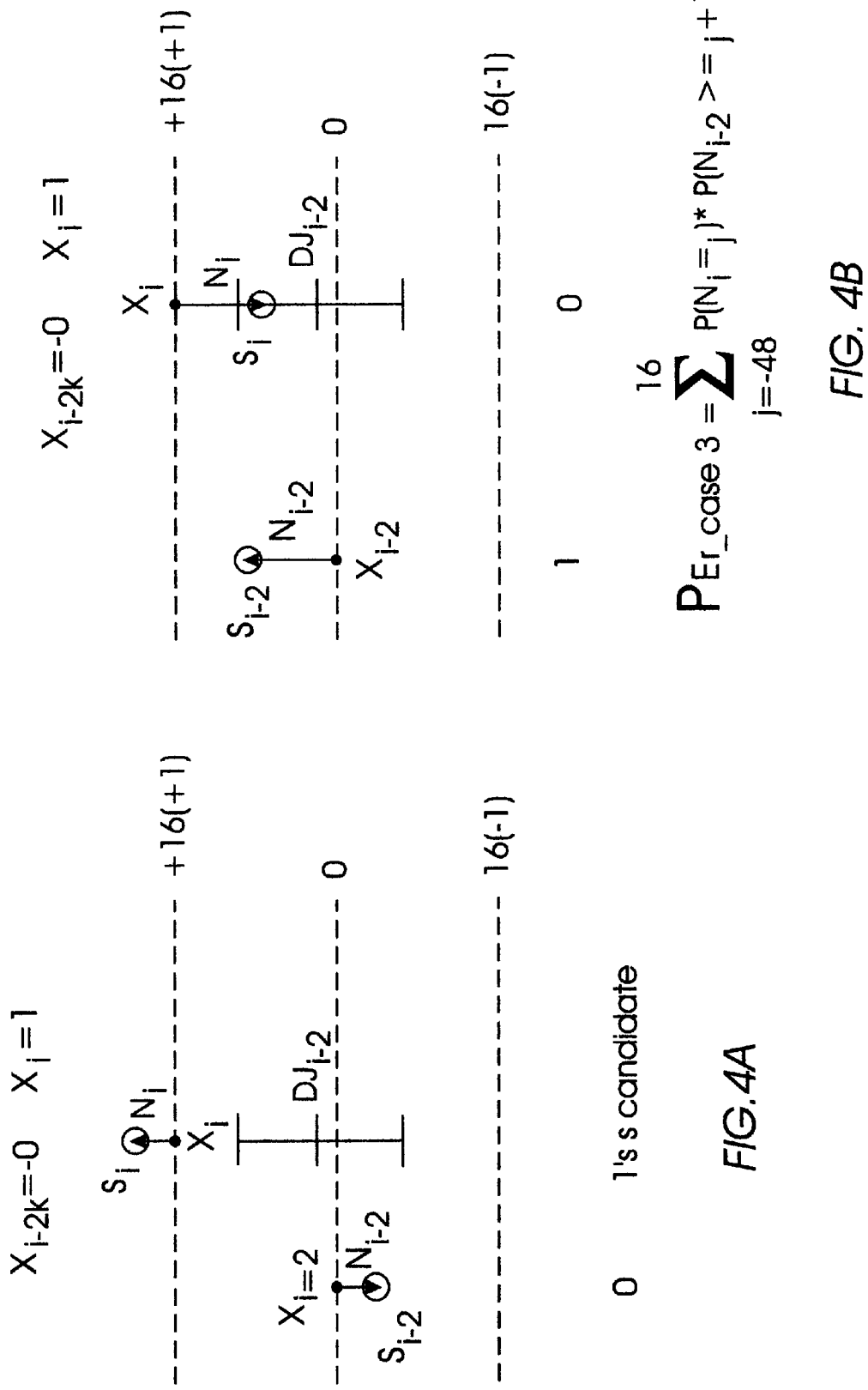
FIGS. 4A and 4B are graphic representations of exemplary good and bad sample detection cases, respectively, for case 3 shown in FIG. 1.
Figure 5:
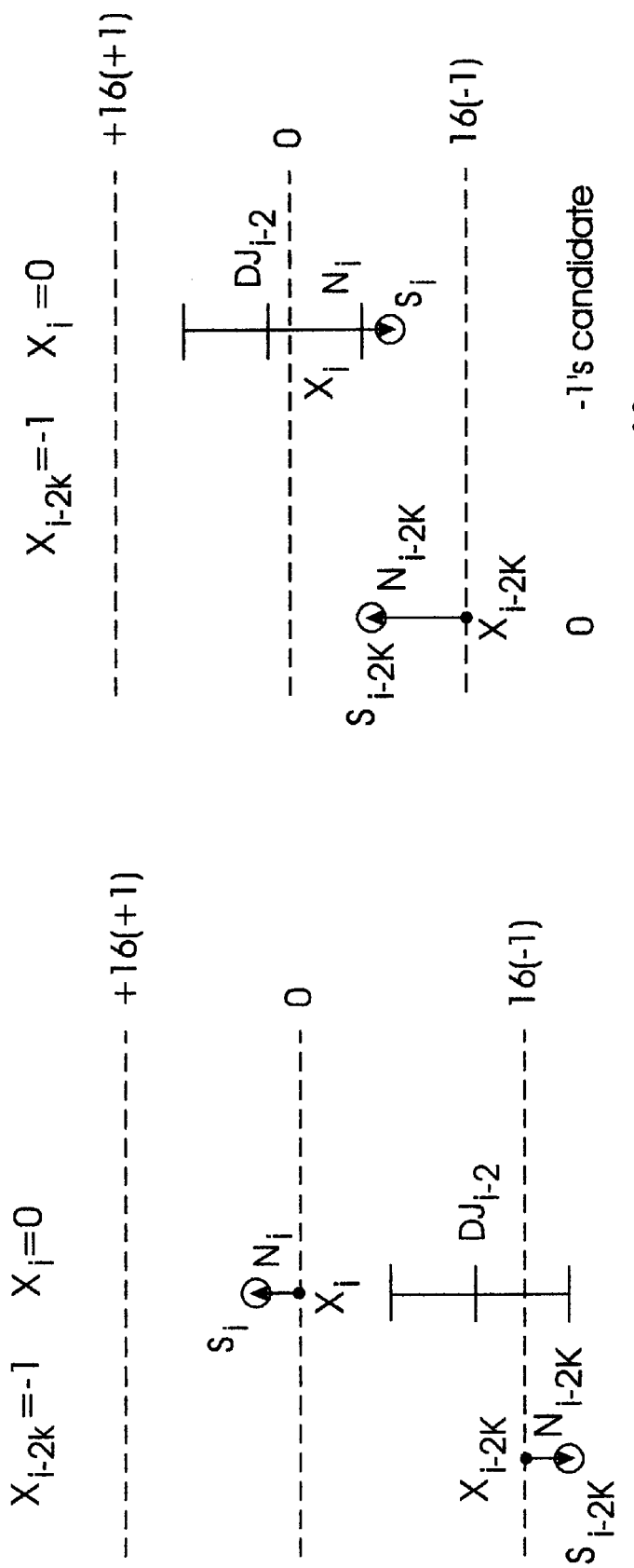
Figure 6:
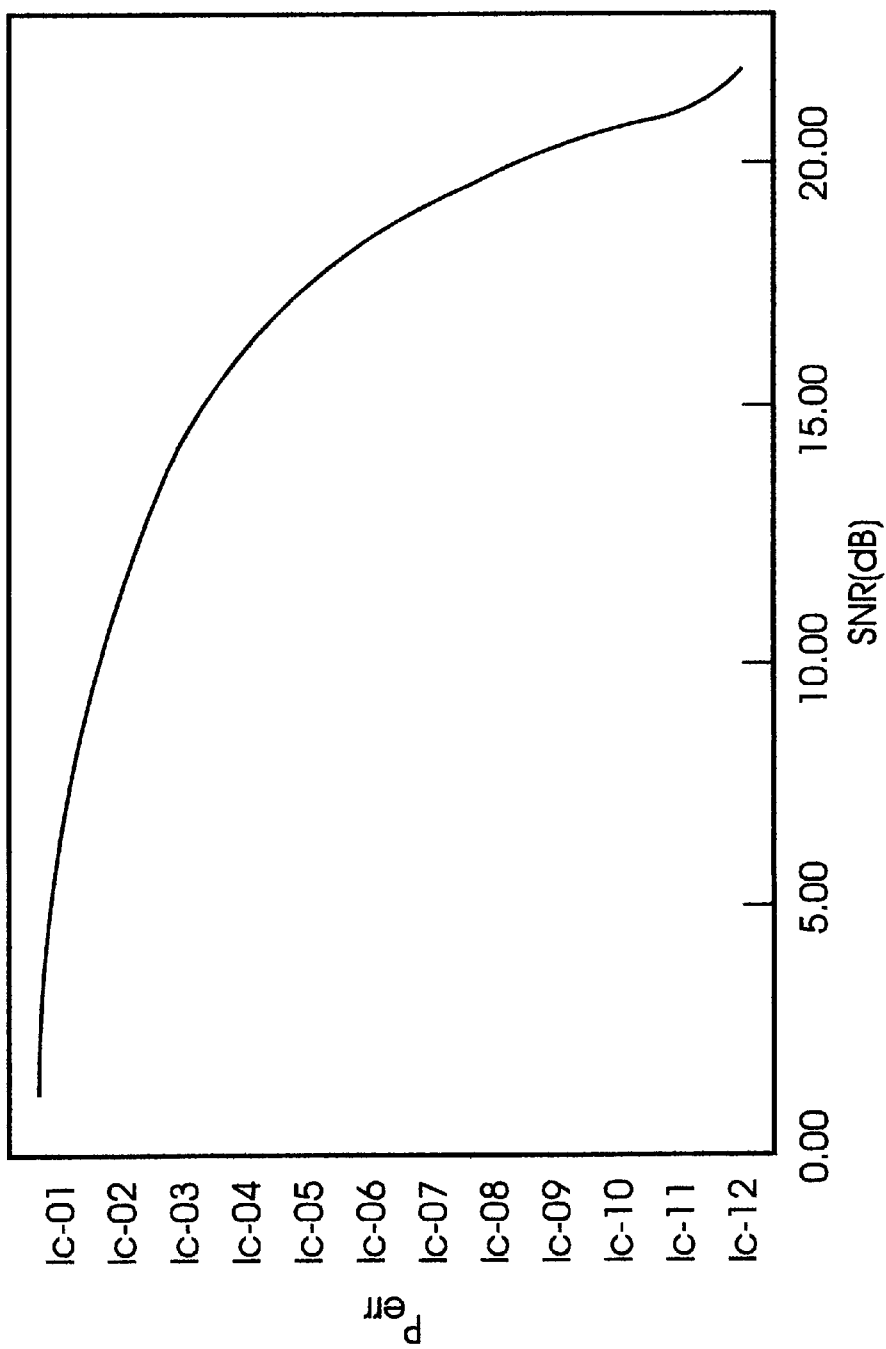
FIG. 6 shows a graph of Viterbi detector error probability ($P_{err}$) versus signal-to-noise ratio (SNR) in accordance with Equation (2)
Figure 7:
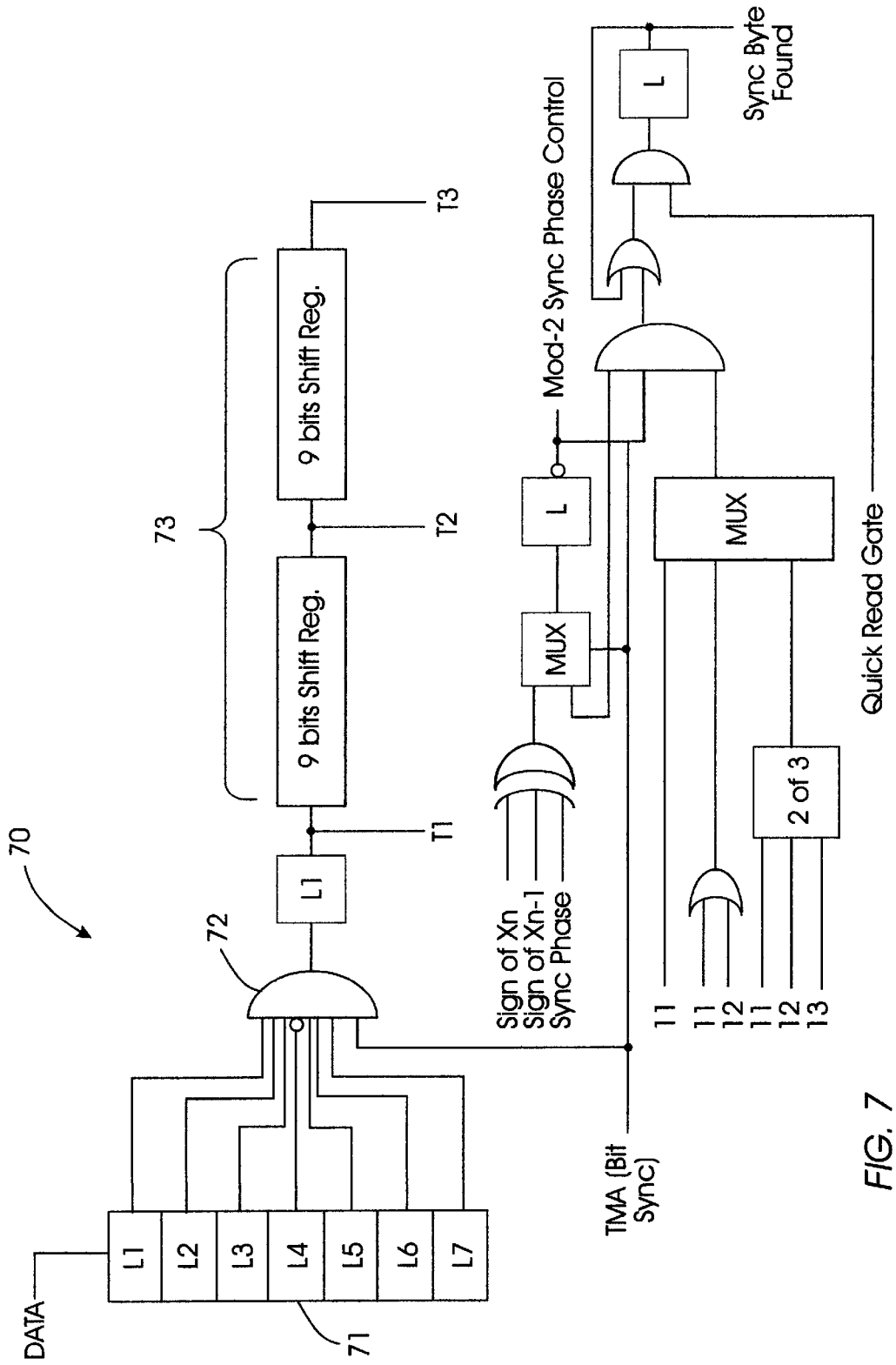
FIG. 7 shows a schematic block diagram of a conventional byte synchronization circuit.
Figure 8:
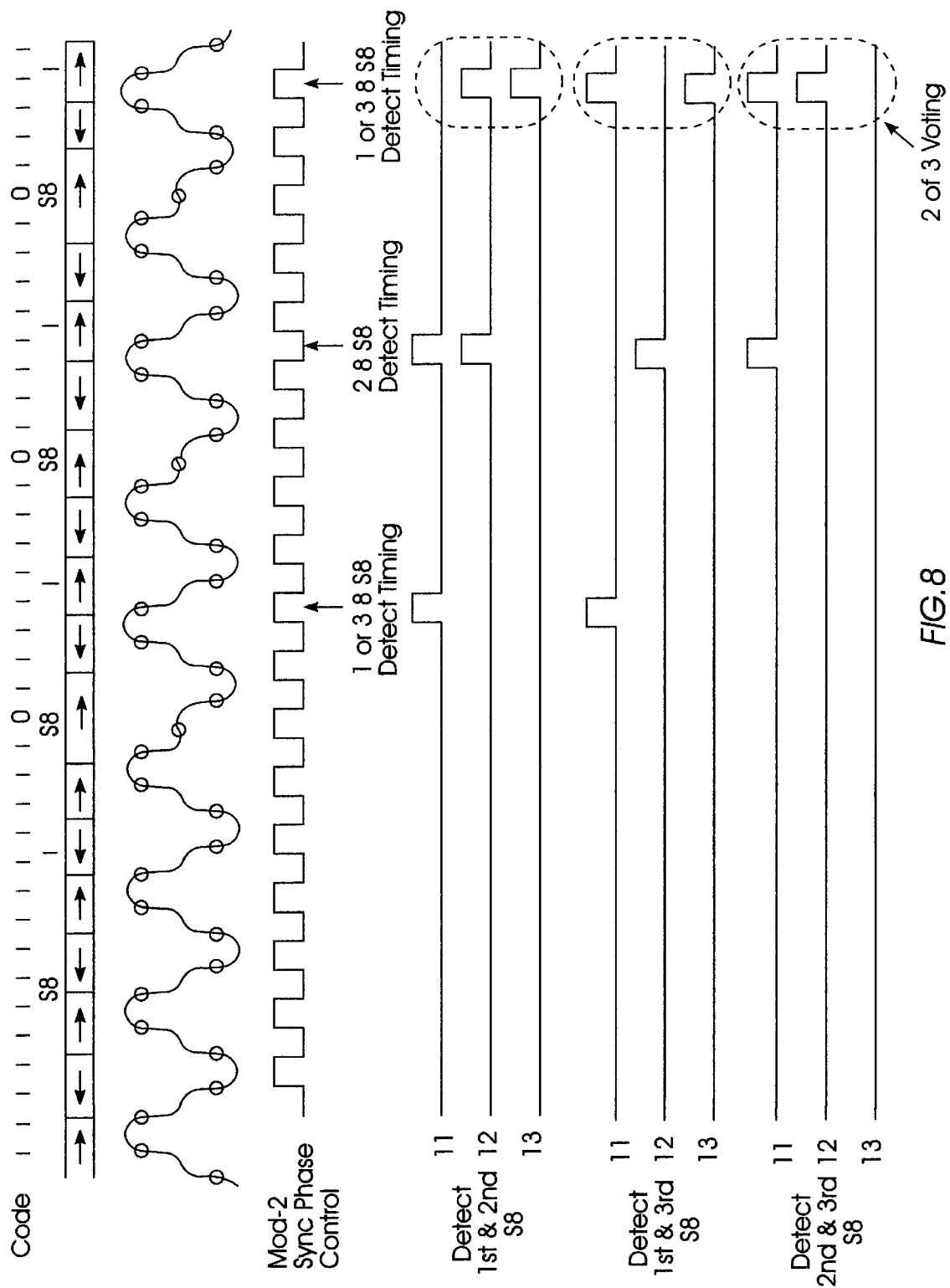
FIG. 8 shows a timing diagram for the conventional byte synchronization circuit of FIG. 7.
Figure 9:
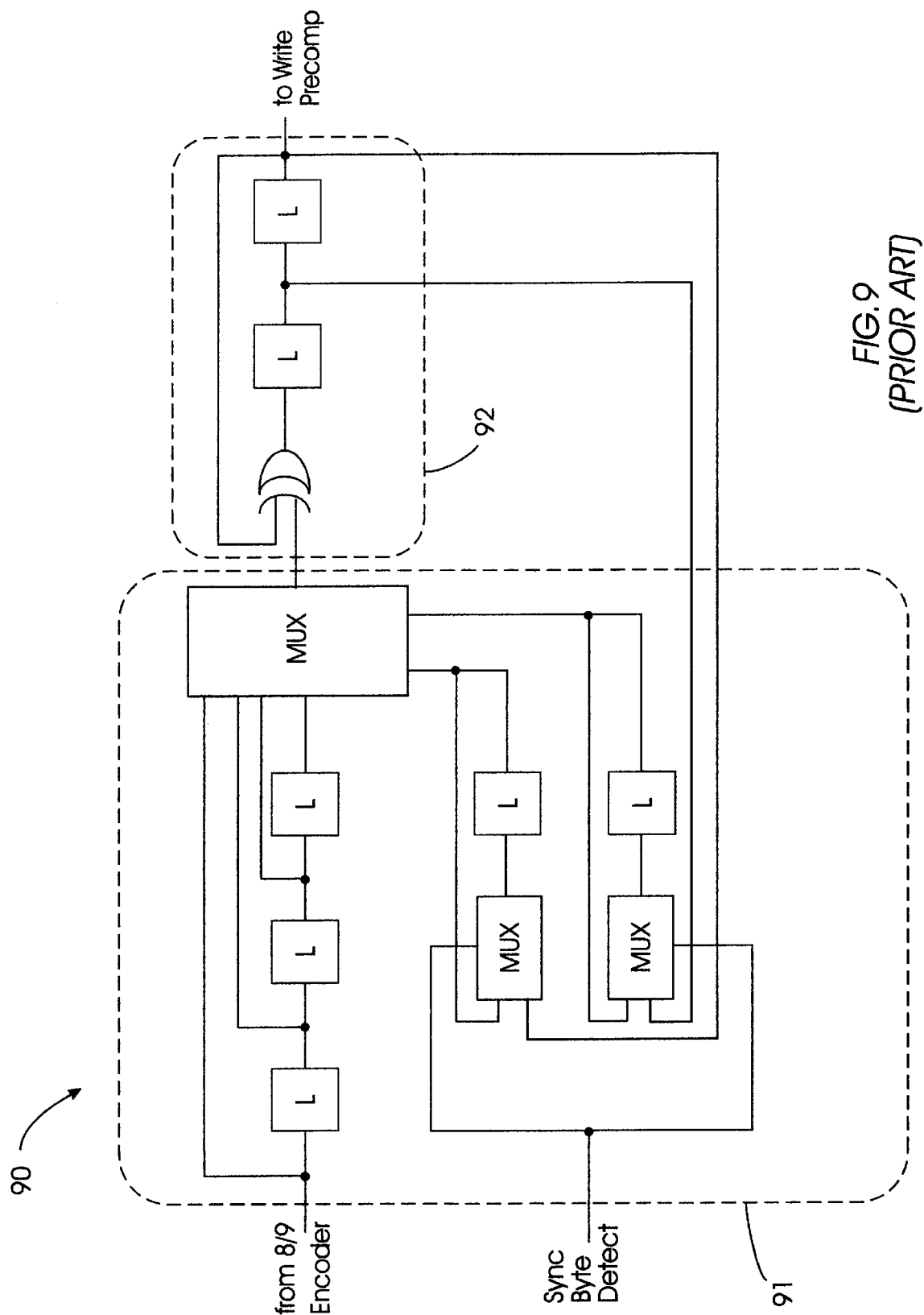
FIG. 9 shows a schematic block diagram of a conventional write circuit including a conventional magnet trimming circuit that operates in conjunction with the conventional byte synchronization circuit of FIG. 7.
Figure 10:
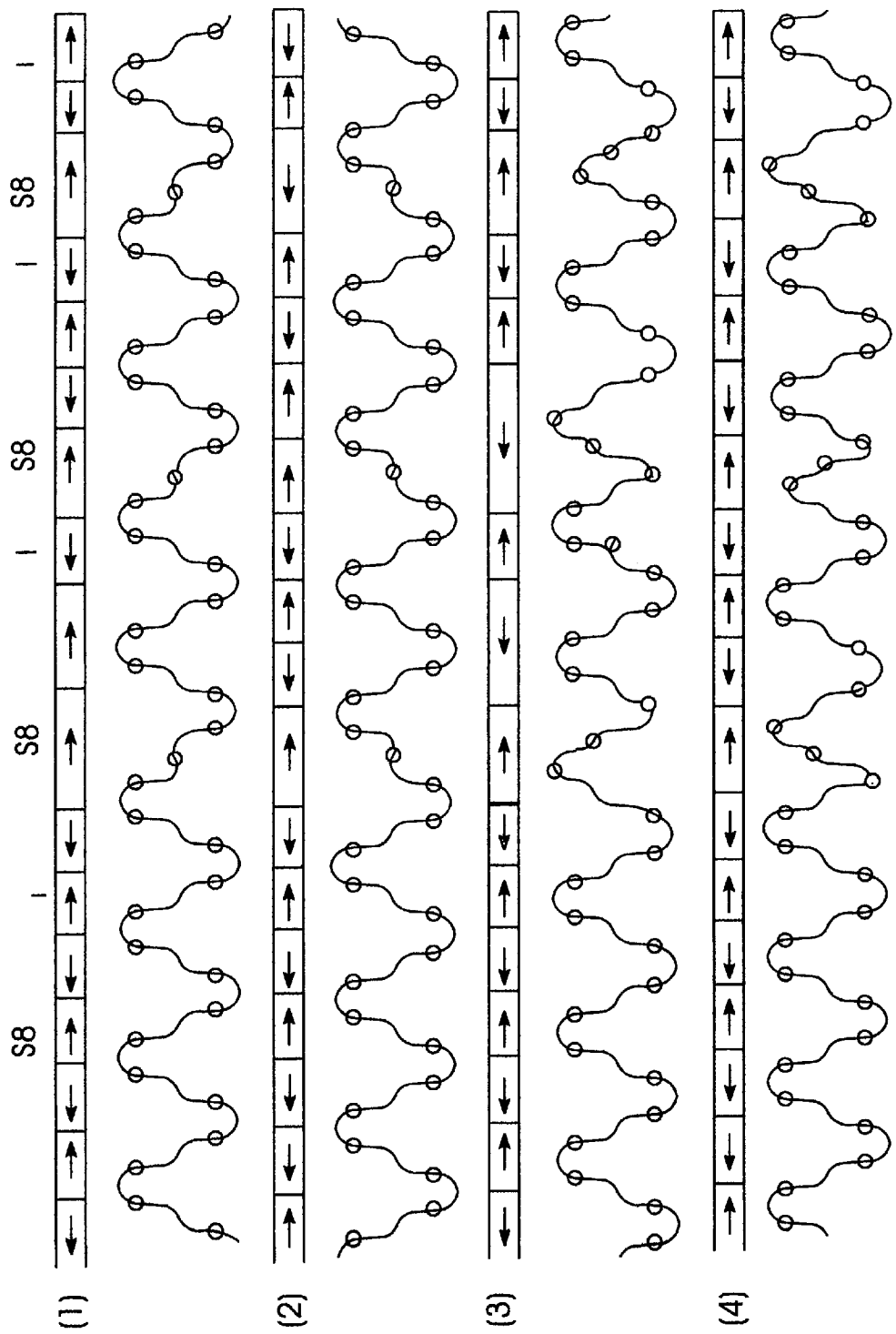
FIG. 10 is a diagram of four possible magnet patterns for the synchronization pattern (111 . . . 111101111101111111011111 . . . 11)
Figure 11:
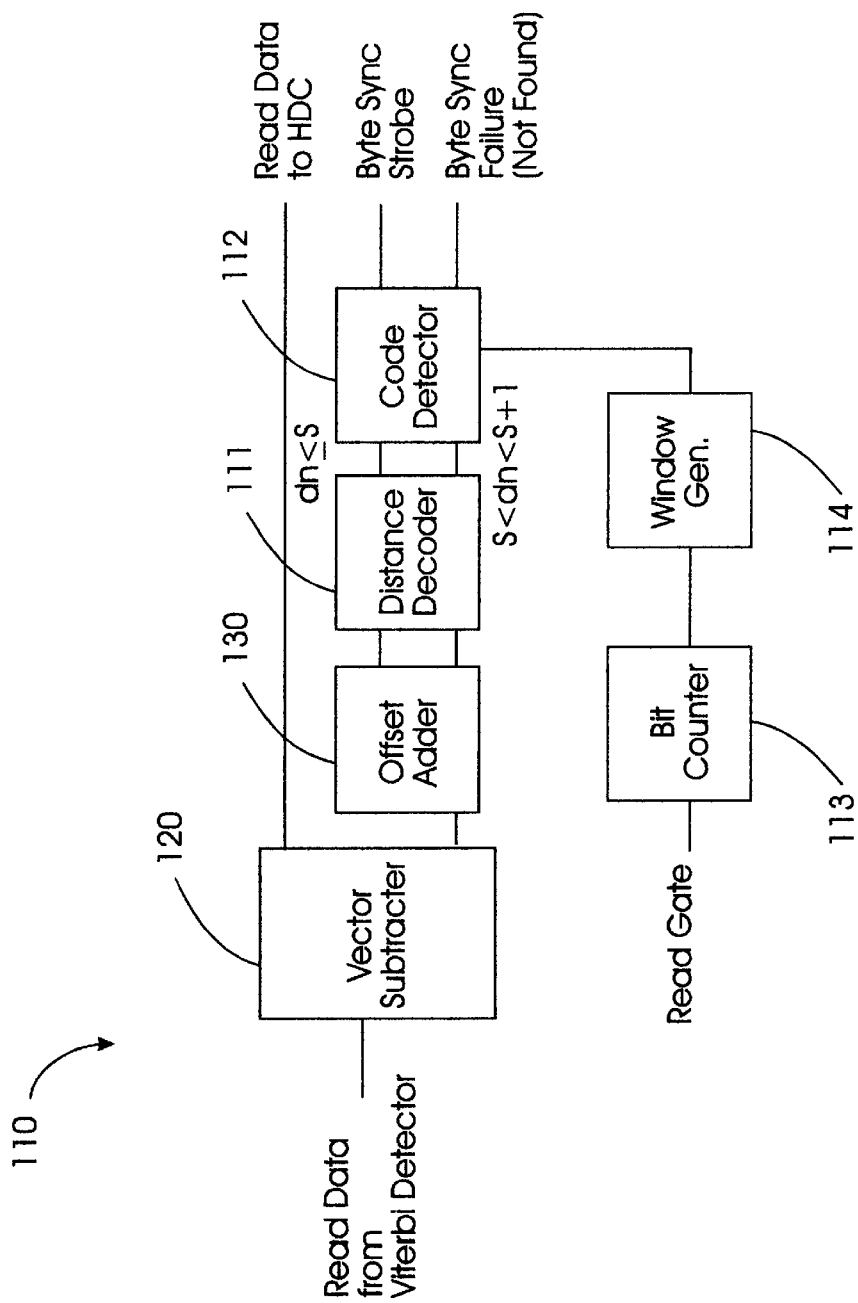
FIG. 11 shows a schematic block diagram of an Error Correcting Code (ECC) byte synchronization detector circuit according to the present invention.
Figure 12B:
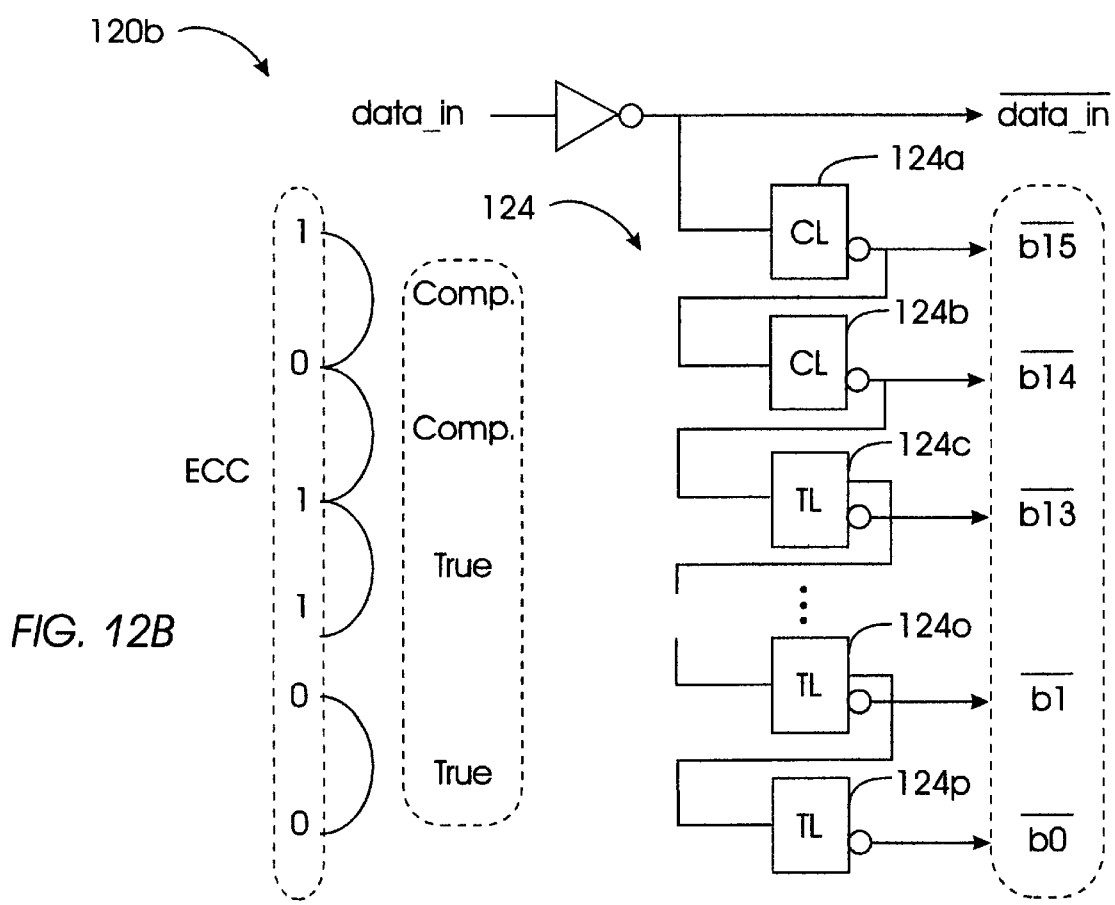
FIG. 12B shows a schematic block diagram of a vector subtracter circuit according to the present invention.
Figure 13:
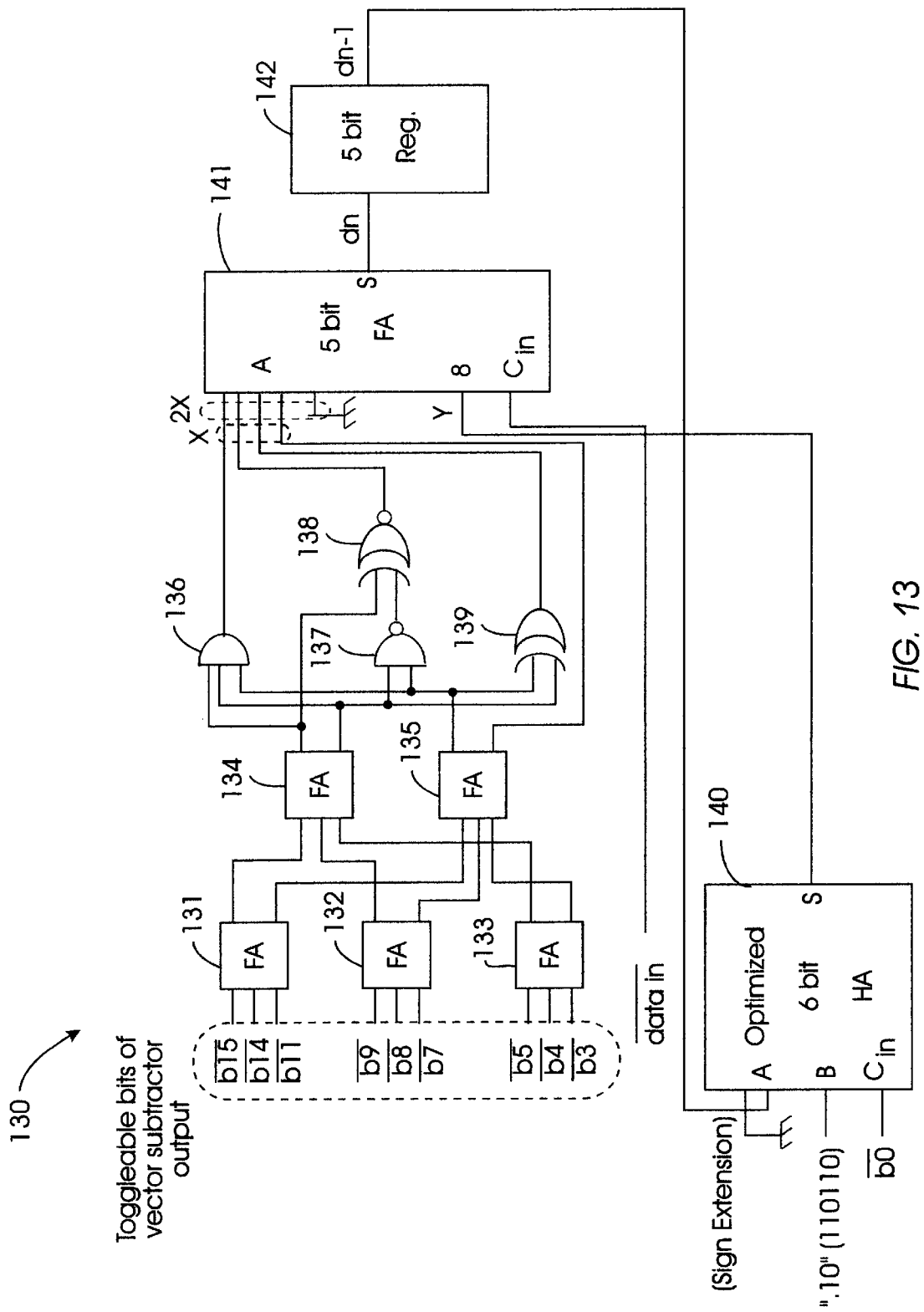
FIG. 13 is a schematic block diagram of an offset adder circuit according to the present invention.

FIG. 11 shows a schematic block diagram of an ECC byte synchronization detector circuit 110 according to the present invention. Byte synchronization detector circuit 110 includes a vector subtractor circuit 120, an offset adder circuit 130, a distance decoder circuit 111 and a code detector circuit 112. Vector subtractor circuit 120 and offset adder circuit 130 form the primary portion of circuit 110, and provide vector subtraction and addition of the elements of the ECC code for obtaining the Hamming distance between a zero vector and an error vector. A bit counter 113 and a window generator 114 operate in a well-known manner for producing a detecting window during the period of time when the ECC code is expected to occur. FIG. 12B shows a schematic block diagram of vector subtractor circuit 120b. FIG. 13 is a schematic block diagram of offset adder circuit 130.

Figure 12A:
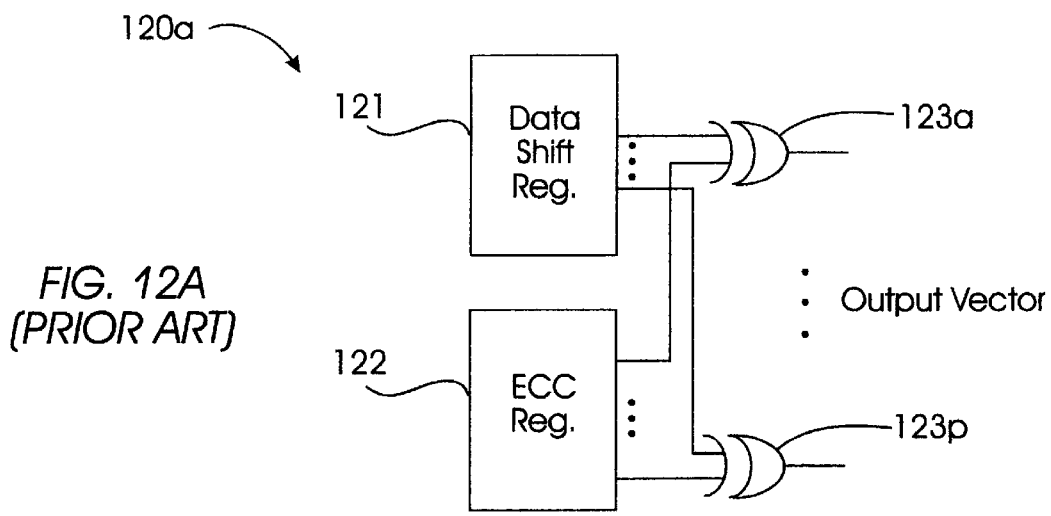
FIG. 12A shows a schematic block diagram of a conventional vector subtraction circuit.

FIG. 12A shows a conventional vector subtraction circuit 120a, which includes a data shift register 121, an ECC register 122 and a plurality of exclusive-or gates 123a–123p. The number of bits of data shift register 121, ECC register 122 and gates 123 equals the number of bits used in the ECC pattern. A shorter ECC, as used by the present invention, results in less hardware. Preferably, the ECC pattern of the present invention uses 16 bits. Data shift register 121 receives read data from a Viterbi detector (not shown). The output of data shift register 121 and the output of ECC register 122 are exclusive-or'ed by gates 123a–123p to produce an output vector that is applied to offset adder 130. Instead of the complicated circuit in FIG. 12A, the present invention uses the much simpler and faster circuit shown in FIG. 12B.

FIG. 12B shows a schematic block diagram of a vector subtractor 120b. Vector subtractor 120b includes latches 124a–124p. The number of latches 124 is equal to the number of bits used in the ECC code of the present invention. The output of each latch 124 or its complement is hard wired to the next latch input, as shown in FIG. 12B. That is, if two consecutive symbols of the ECC in the dotted frame are the same, the output of the physically corresponding latch is directly connected to the input of the subsequent latch, and is denoted in FIG. 12B as a TL latch. If two consecutive symbols are different, the compliment of the output of the latch is connected to the input of the subsequent latch, and is denoted in FIG. 12B as a CL latch. FIG. 12B shows a portion of an exemplary 16-bit ECC code in Table I and the corresponding configuration of TL and CL latches 124.

Although vector subtractor 120b has the same number of outputs as the length of the ECC pattern, about half of the outputs have the same value as previous bits of the pattern. Consequently, vector addition can be performed using only the specific bits that are expected to flip or change. No distance change occurs if all latches are TL latches because a TL latch just propagates a "1" or "0" to the subsequent latch at the next state. That is, distance change occurs if there is a CL latch. When CL latch output is "0", "1" will be propagated to the following latch at the next cycle, causing an increase of the Hamming Distance by 1. On the contrary, when a CL latch output is "1", the Hamming Distance will be decreased by 1. Based on this, the difference (delta) of the Hamming Distance is calculated by just checking the output of the CL latches. The circuit in FIG. 12B is based on the 16-bit ECC code in Table I and its CL latches' outputs are "b15 bar, b14 bar, b11 bar, b9 bar, b8 bar, b6 bar, b5 bar, b4 bar, b3 bar." The Hamming Distance delta "delta 1" cause by the aforementioned "bi bars" is $$\text{delta } 1 = 2x - 9, \quad (4)$$

where x equals the number of "1s" among the aforementioned "bi bar" group. The Hamming Distance delta "delta 2" cause by "b0 bar" and "data in bar" is $$\text{delta } 2 = \overline{\text{data\_n}} + \overline{b0} + 1. \quad (5)$$

The Hamming Distance at time n, $d_n$, is expressed in terms of $d_{n+1}$, the distance at time n−1, by:

$$d_n = d_{n-1} + \text{delta } 1 + \text{delta } 2. \quad (6)$$

Substituting delta 1 and delta 2 in Equation (6) with Equation (4) and Equation (5), $$d_n = d_{n-1} + 2x + \overline{\text{data\_in}} + \overline{b0} - 10. \quad (7)$$

Based on Equation (7), offset adder circuit 130 (FIG. 14) requires an initial value of $d_{n-1}$. Consequently, before a read operation, offset adder circuit 130 is preset to a value of 9, the distance between the ECC pattern and the all "1" vector used for VCO bit synchronization.

FIG. 13 shows that offset adder circuit 130 includes full adders (FA) 131–135, gates 136–139, optimized half-adder (HA) 140, 5-bit full adder 141 and 5-bit register 142. Offset adder circuit 130 first calculates the difference (offset) between the Hamming Distance of the current symbol and that of the next symbol. Then, the offset is added to the current distance for obtaining the distance of the next pattern. Offset adder 130 calculates 2× and ($d_{n-1}$+b0 bar−10) in parallel. Therefore, multiple value additions are implemented using fewer stages and with less delay than is conventionally done. As a result, additional latches are not needed to compensate for the increased time delay experienced by conventional approaches. Further, offset adder circuit 130 reduces the data skew at the final adder input and reduces the number of full adders that are required.

Figure 14:
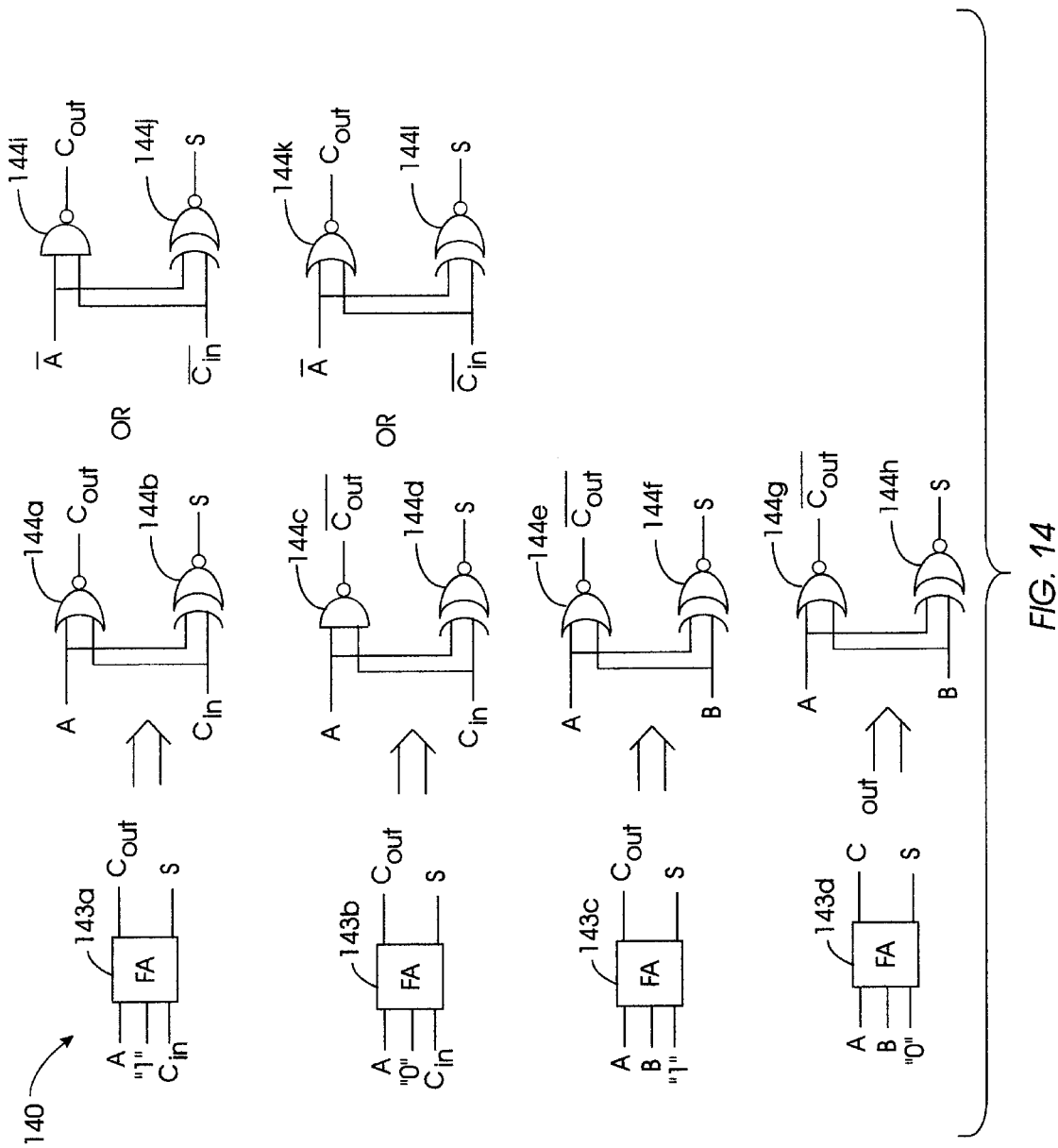
FIG. 14 is a schematic block diagram of an optimized half-adder circuit according to the present invention.
Figure 15:
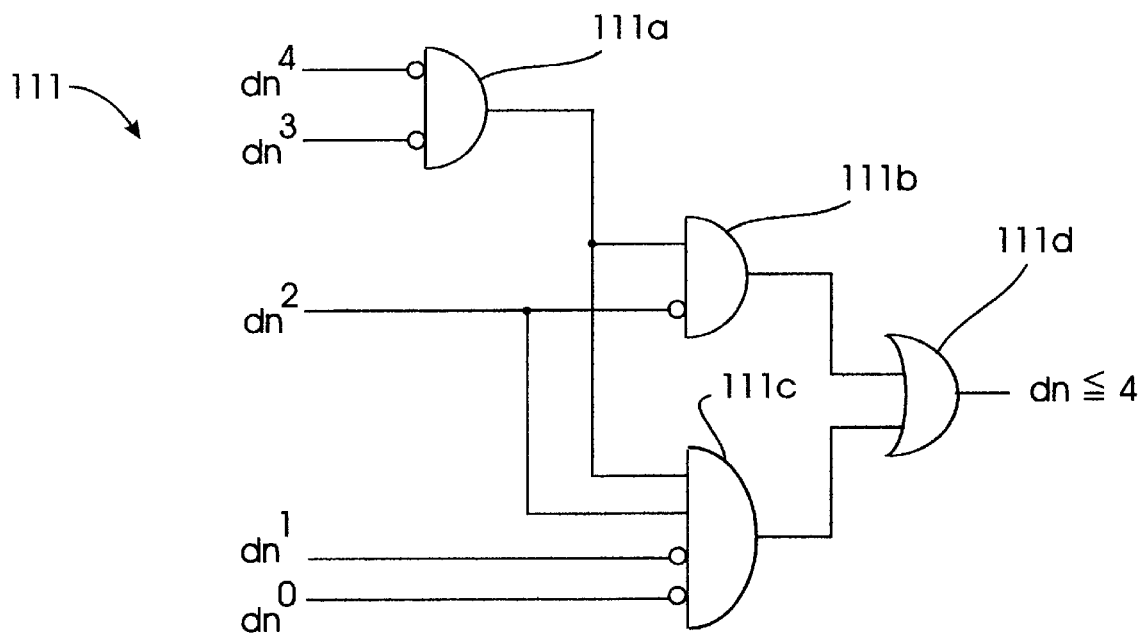
FIG. 15 is a schematic block diagram of an optimized distance decoder circuit according to the present invention.

FIG. 14 is a schematic block diagram of optimized half-adder circuit 140. Half-adder circuit 140 is replaced with full adders 143a–143d. Full adders 143a–143d are formed from 12 gates 144a–144l. FIG. 15 is a schematic block diagram of an optimized distance decoder circuit 111 which detects $d_n \leq 4$. Distance decoder 111 is formed from 4 gates 111a–111d.

While the present invention has been described in connection with the illustrated embodiments, it will be appreciated and understood that modifications may be made without departing from the true spirit and scope of the invention.

What is claimed is:

1. A byte synchronization detection circuit comprising:
    a vector subtractor circuit determining an error vector between a current read data pattern and a synchronization bit pattern; and
    an offset adder circuit determining a distance of the next read data pattern by adding a difference between a Hamming Distance from a current error vector to the synchronization bit pattern and a Hamming Distance from a next error vector to the synchronization bit pattern using selected bits of the error vector determined by the vector subtractor circuit to a distance of the current read data pattern.

2. The byte synchronization detection circuit according to claim 1, wherein the offset adder circuit further determines a difference between the Hamming Distance of the current read data pattern to the synchronization bit pattern and a Hamming Distance of the next read data pattern to the synchronization bit pattern.

3. The byte synchronization detection circuit according to claim 2, wherein the vector subtractor circuit includes a shift register formed from a plurality of sequentially connected latches, each latch having an output polarity that corresponds to an exclusive-or'ed result of two adjacent synchronization bit patterns, the synchronization bit pattern formed from a predetermined sequence of first and second predetermined output polarities, and the output of the latches generates the error vector between the current read data pattern and the synchronization bit pattern.

4. The byte synchronization detection circuit according to claim 3, wherein the output polarity of each latch is a signal representing one of a "1" and a "0".

5. The byte synchronization detection circuit according to claim 3, wherein the synchronization bit pattern is between 16 and 18 bits in length, inclusive.

6. The byte synchronization detection circuit according to claim 5, wherein the synchronization bit pattern is 16 bits in length.

7. The byte synchronization detection circuit according to claim 3, wherein a probability of synchronization failure and mis-synchronization is about $1 \times 10^{-9}$ at about 16 dB signal-to-noise ratio.

8. The byte synchronization detection circuit according to claim 7, wherein the probability of synchronization failure and mis-synchronization is about $1 \times 10^{-16}$ at about 19 dB signal-to-noise ratio.

9. A method of byte synchronization, the method comprising the steps of:
    determining an error vector between a current read data pattern and a synchronization bit pattern; and
    determining the Hamming Distance of the next read data pattern by adding a difference of a Hamming Distance determined by using selected bits of the error vector to a Hamming Distance of the current read data pattern.

10. The method according to claim 9, further comprising the step of determining a difference between a Hamming Distance of the current read data pattern to the synchronization bit pattern and a Hamming Distance of the next read data pattern to the synchronization bit pattern.

11. The method according to claim 10, wherein the synchronization bit pattern is between 16 and 18 bits in length, inclusive.

12. The method according to claim 11, wherein the synchronization bit pattern is 16 bits in length.

13. The method according to claim 11, wherein a probability of synchronization failure and mis-synchronization is about $1 \times 10^{-9}$ at about 16 dB signal-to-noise ratio.

14. The method according to claim 13, wherein the probability of synchronization failure and mis-synchronization is about $1 \times 10^{-16}$ at about 19 dB signal-to-noise ratio.

* * * * *